United States Patent [19]
Phillips

[11] 4,419,633
[45] Dec. 6, 1983

[54] PHASE LOCK LOOP

[75] Inventor: Donald E. Phillips, Cedar Rapids, Iowa

[73] Assignee: Rockwell International Corporation, El Segundo, Calif.

[21] Appl. No.: 221,133

[22] Filed: Dec. 29, 1980

[51] Int. Cl.³ .............................................. H03L 7/06
[52] U.S. Cl. ...................................... 331/17; 331/18; 331/25; 331/DIG. 2
[58] Field of Search ............... 331/DIG. 2, 108 C, 17, 331/18, 23, 25, 34

[56] References Cited

U.S. PATENT DOCUMENTS 3,337,814  8/1967  Brase et al. ............................ 331/18
3,370,252  2/1968  Zoerner ................................. 331/18

Primary Examiner—Siegfried H. Grimm
Assistant Examiner—Tim A. Wiens
Attorney, Agent, or Firm—Richard K. Robinson; Howard R. Greenberg; H. Fredrick Hamann

[57] ABSTRACT

A variable voltage control oscillator can have its output frequency varied over a wide range of frequencies with a high degree of accuracy at each frequency and a rapid tune time is achieved when there is a reference signal source that runs at a constant frequency and is held to a high degree of accuracy and a counter for normalizing the output frequency of the VCO and a coincidence detector which compares the reference frequency to the normalized output frequency and provides an error correcting signal that adjusts the VCO to change the frequency very rapidly without having a frequency overshoot.

6 Claims, 5 Drawing Figures

PHASE LOCK LOOP

BACKGROUND OF THE INVENTION

This invention relates to voltage controlled oscillators.

There are many examples of voltage controlled oscillators known in the prior art as well as different apparatuses and methods for generating the control signals for controlling these oscillators and, consequently the output frequency. Examples of these are illustrated in the following U.S. Pat. Nos. 4,190,807, 4,087,628, 4,083,014, 4,083,015, 4,031,483, 3,755,746, 3,611,168, and 3,286,188.

SUMMARY OF THE INVENTION

In the situations where a voltage controlled oscillator and its associated phase-lock loop is required to have a rapid lock time for large frequency jumps, the performance of the prior art circuits was limited especially in the cases where the oscillators were subject to broad bandwidth requirements. The compensating capacitor limits the bandwidth because it has its charge changed rapidly by an externally applied charging current, beginning when phase lock is lost, and ending when phase lock is again achieved. However, full efficiency of this approach is not achievable in the prior art because the correct phase is not obtained at the same time that the correct frequency of the oscillator is achieved. Consequently, the frequency in normal operation tends to overshoot producing a considerable time lapse before a correct phase and frequency relationship is obtained.

A variable voltage controlled oscillator can have its output frequency varied over a wide range of frequencies with a high degree of accuracy at each frequency when there is a constant frequency reference signal source with a high degree of accuracy, a counter for normalizing the output frequency of the voltage control oscillator (VCO) and a coincidence detector which compares the reference frequency to the normalized output frequency and provides an error correcting signal that adjusts the VCO to change the frequency very rapidly without producing a frequency overshoot.

The referenced oscillator is used to not only synchronize the coincidence detector but is also used to synchronize the normalizing circuit which thus will cancel out the phase error by reinitializing the normalizing circuit at each reference pulse until phase lock is achieved so that the desired frequency and phase values are reached simultaneously.

BRIEF DESCRIPTION OF THE DRAWINGS

The following detailed description will enable the invention to be more fully comprehended. A list of relevant figures accompanies the description in which.

DETAILED DESCRIPTION OF THE PREFERRED EMBODIMENT

Figure 1:
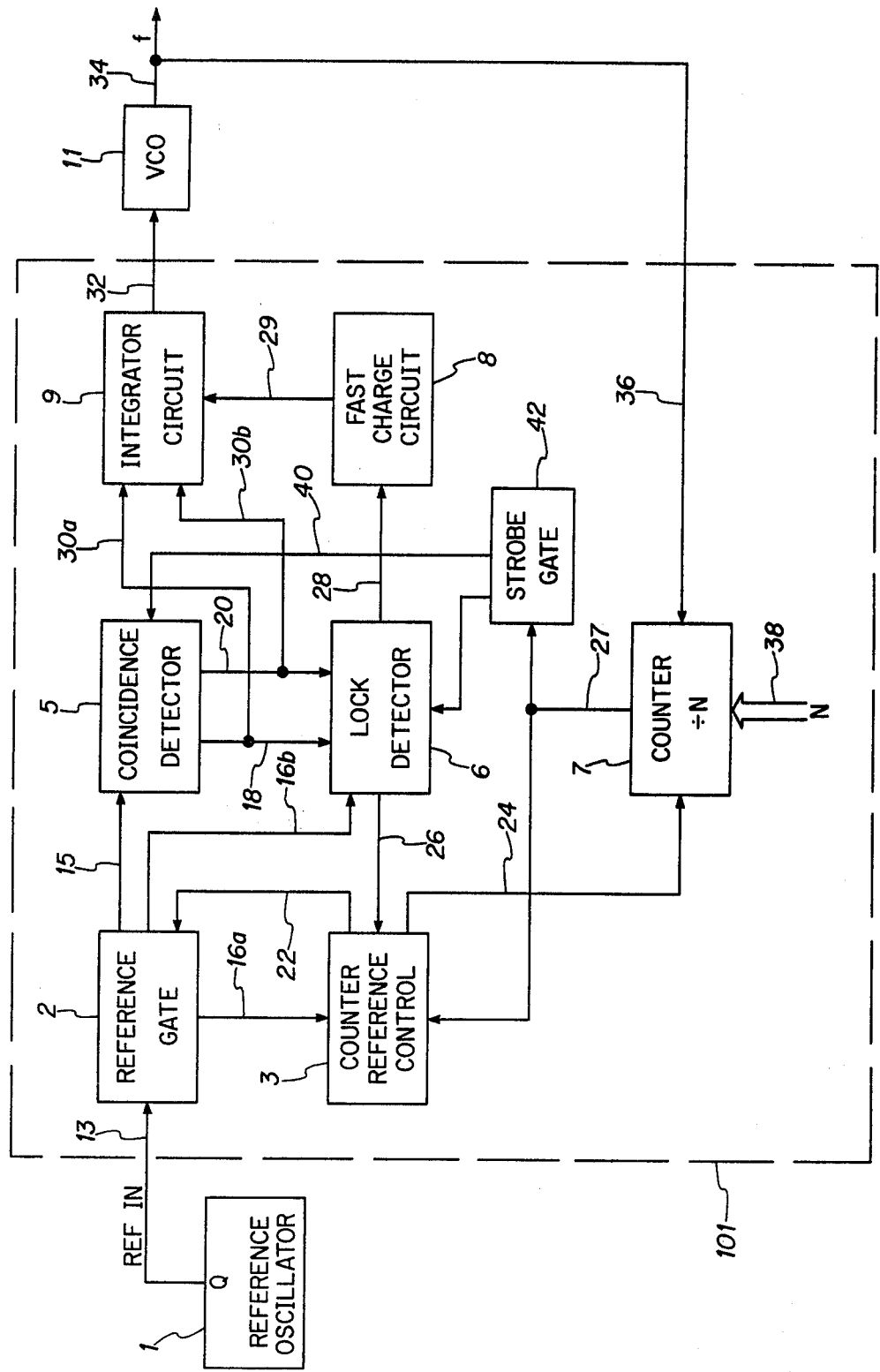
FIG. 1 is a block diagram of the voltage controlled oscillator circuit according to the invention.

FIG. 1, to which reference should now be made, is a block diagram of a voltage controlled oscillator incorporating the preferred embodiment of the invention. There is a reference oscillator 1 which may be a precision temperature compensated crystal oscillator that provides a reference signal via conductor 13 to a reference gate 2. The reference gate 2 shapes the reference signal to a pulse having a defined pulse width and applies the pulse to a coincidence detector 5 via conductor 15 and to a counter reference control 3 via conductor 16a as well as to a lock detector circuit 6 via conductor 16b. The counter reference control 3 is used in conjunction with a ÷N counter 7 to normalize the output frequency from the voltage controlled oscillator, VCO 11, which is applied via conductor 36 to the ÷N counter 7. The process of normalizing a variable output frequency so that it may be compared with a standard fixed frequency reference signal provides for dividing the output frequency by N where N is a number that when divided into the output frequency produces the frequency of the output of the reference oscillator 1. One particular benefit derived from this process is the ability to change the frequency of the voltage controlled oscillator simply by changing the value of N which may be entered into the ÷N counter 7 via data bus 38. The ÷N counter 7 is controlled by the counter reference control 3 which is triggered by the output from the reference gate 2. This control is applied to the ÷N counter 7 via conductor 24 and will insure that the counter will complete its dividing process under matched conditions at the same time that a pulse is provided from the reference gate 2. This ensures that both the frequency and the phase of the voltage controlled oscillator can be maintained especially during the process of changing the number N and, consequently, the output frequency.

In the preferred embodiment, the output frequency of the reference oscillator 1 should be equal to the output frequency of the voltage controlled oscillator when N=1. The output from the ÷N counter is applied via conductor 27 to a strobe gate 42 which shapes the output from the ÷N counter into a pulse whose width is equal to the output pulse from the reference gate 2 after which the shaped pulse is applied to the coincidence detector 5 via conductor 40. The coincidence detector 5 compares the pulse that is present on conductor 40 with the pulse that is present on conductor 15 and if the rising edge and trailing edge of the two pulses do not coincide, then an output signal is applied via conductor 18 or 20 to the lock detector 6 indicating that there is an error which in turn results in the fast charge circuit 8 via conductor 28 causing the integrator circuit 9 to change the value of the voltage level that is applied to the voltage controlled oscillator 11 via conductor 32.

The integrator circuit 9 integrates the signal that is present on conductor 30 to provide a signal to the voltage controlled oscillator 11 via conductor 32 and in the case where there is an out-of-lock condition as indicated by the signal on conductor 28 to the fast charge circuit, then the integrator circuit 9 operation is accelerated via the signal that is applied thereto via conductor 29.

Figure 2:
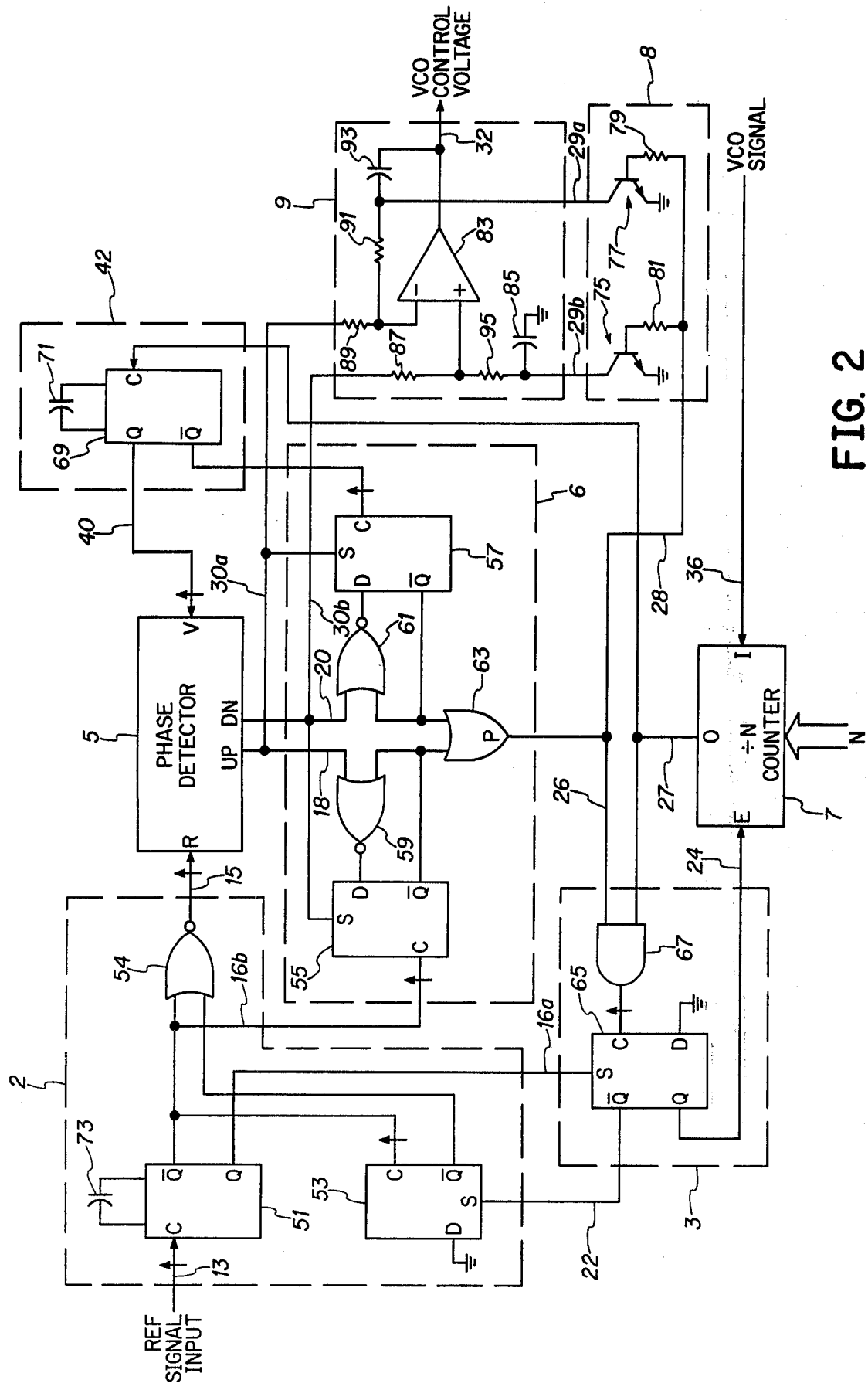
FIG. 2 is a schematic diagram of the voltage controlled oscillator according to FIG. 1.
Figure 4:
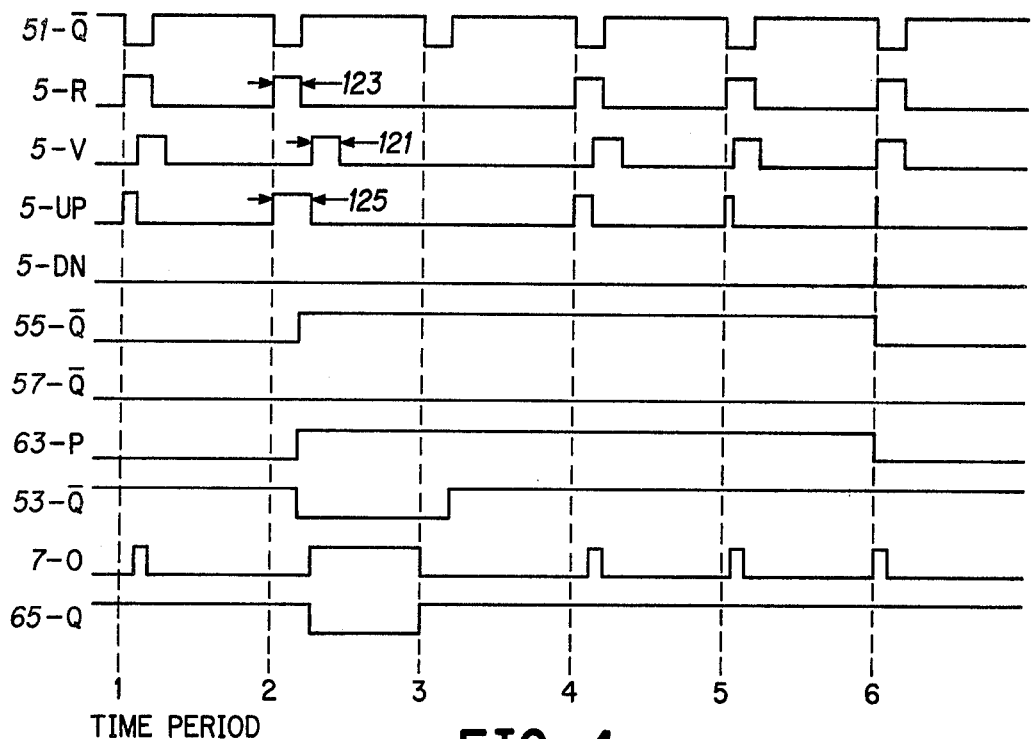
FIG. 4 is a timing diagram illustrating the operation of the circuitry of FIG. 2 when there is to be an increase in output frequency from the voltage controlled oscillator.
Figure 3:
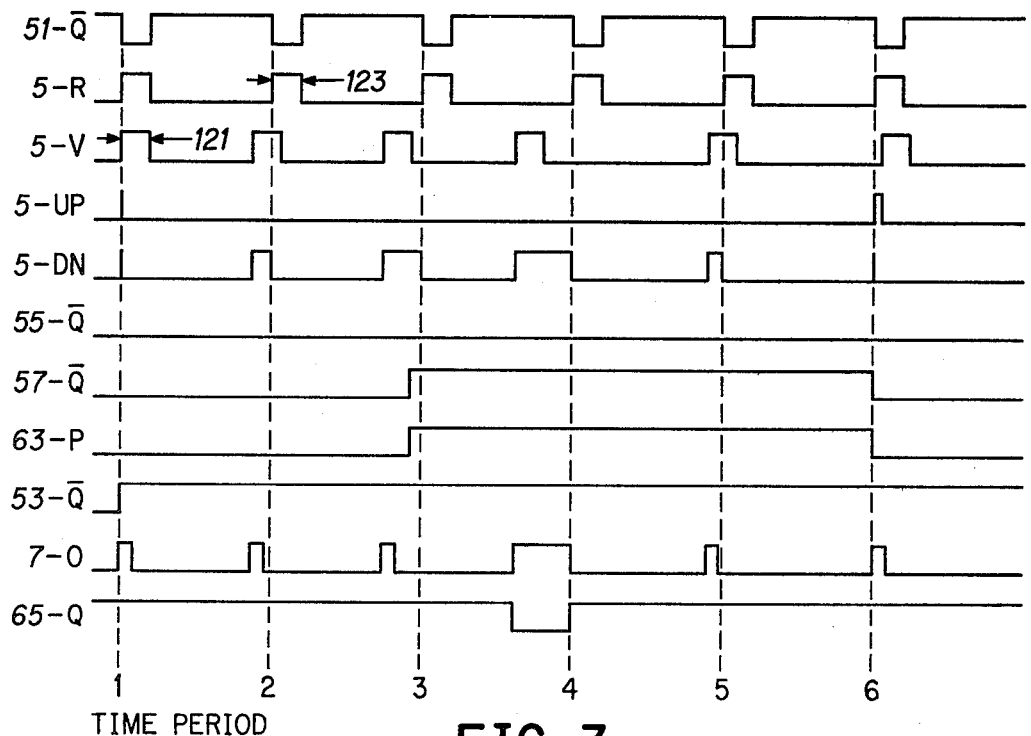
FIG. 3 is a timing diagram illustrating the operation of the circuitry of FIG. 2 when there is a requirement for a decrease in output frequency.

The operation of the circuitry illustrated in FIG. 2 may be best understood when compared to the timing diagrams of FIGS. 3 and 4. The waveforms of FIGS. 3 and 4 are numbered according to the terminal (shown in FIG. 2) that the waveforms originated from. As was discussed in conjunction with FIG. 1, the phase detector 5 compares the pulses from the reference gate 2 with the pulses from the strobe gate 42 and provides an output pulse either on terminals 5-UP or 5-DN when the edges of the pulses that are applied to the phase detector do not coincide.

FIG. 3 provides for the case when the pulse that is present on terminal 5-R leads the pulse that is present on terminal 5-V indicating that the output frequency of the VCO needs to be increased and alternatively, as shown in FIG. 4, when the pulse that is present on terminal 5-V leads the pulse that is present on terminal 5-R, then there is provided on terminal 5-DN of the phase detector, pulses that indicate that the output frequency from the VCO 11 needs to be decreased. There are two types of frequency corrections that are implemented. The first type is when there is only a small frequency deviation detected by the phase detector such as those types of errors that occur when there is a small frequency drift in the output of the voltage control oscillator or a small increment in the number N that is applied to the divide by N ($\div$N) counter. The small errors will produce a pulse on either the 5-UP terminal or the 5-DN terminal applied to the integrator 9 and integrated thereby to change the level of the VCO control voltage that is present at the output of integrator 9 on conductor 32. The second case is when there is a requirement for a large frequency change from the VCO such as the case when a large change in N is loaded into the $\div$N counter. In this case, the fast charge circuit 8 is activated and the error pulses that are present on the 5-UP terminal or the 5-DN terminal are applied to the integrator 9 where the output level of the VCO control voltage is rapidly changed through the action of the fast charge circuit 8. The activation or the size of the change in VCO frequency necessary to activate the fast charge circuit is a selectible variable that is controlled by the size of the capacitors 71 and 73 of the strobe gate 42 and the reference gate 2, respectively. The fast charge circuit 8 is activated whenever the falling edge of a select pulse of this signal that is present on terminal 5-R occurs prior to the rising edge of a corresponding selected pulse that is present on terminal 5-V or when the falling edge of a selected pulse that is present on terminal 5-V occurs prior to the rising edge of the pulse that is present on terminal 5-R. Accordingly, the sensitivity of the circuit may be varied by changing the widths of the pulses that are represented by waveforms 5-R and 5-V in FIGS. 3 and 4. The width of these pulses, as indicated in FIGS. 3 and 4 by dimension lines 121 and 123, is determined by the size of the capacitors 71 and 73. The operation of the circuit for large changes in the output frequency may be ascertained from the following description and referring to FIGS. 2, 3 and 4 where the example illustrated in FIGS. 2 and 3 is discussed first. Assuming that the circuit is operating at a first frequency $f_1$ and there is a new N applied to the counter indicating that the output frequency $f_1$ present on conductor 34 is to be lowered to frequency $f_2$ between time periods 1 and 2, then the phase detector 5 will indicate that the frequency of the VCO is too high by providing a pulse on the 5-DN terminal. A time period is the period of time between the pulses provided by the multivibrator 51 on the Q and $\bar{Q}$ terminals. Waveform 51-Q of FIGS. 3 and 4 has pulses occurring every time period 1, 2, 3, 4, 5 and 6. The signal that is present on terminal 51-$\bar{Q}$ is applied to the OR gate 54 where it is combined with the Q output from the D flip-flop 53 to obtain on terminal 5-R of the phase detector 5, the signal represented by waveform 5-R. The phase detector 5 compares the signal that is present at terminal 5-R with the signal that is present at terminal 5-V. At the first period, the signal or coincidence pulse appears only as a slight glitch on both the up terminal of the phase detector 5 as indicated by waveform 5-UP of FIG. 3 and the down terminal of the phase detector 5 as represented by waveform 5-DN of FIG. 3. However, at the second period, the signal that is present on terminal 5-V of phase detector 5 leads the signal that is present on terminal 5-R of the phase detector 5 and, consequently, there is a pulse present on terminal 5-DN. This pulse is applied to the integrator circuit 9 which consists of the operational amplifier 83 and gain resistors 87, 89, 91 and 95 and integrating capacitors 85 and 93. The integrator circuit 9 changes the voltage level of the VCO control voltage that is present on conductor 32.

The output signal from the VCO oscillator to be divided by the $\div$N counter 7 which may be a commercially available counter and, in the preferred embodiment, is a CMOS counter, such as 4029 B from RCA Corporation or 14029 B from Motorola Corporation. The counter divides the VCO signal by the number N and at the expiration of the division of the signal will provide a pulse on conductor 27 at the 7-0 terminal. The signal on conductor 27 is applied to the single-shot multivibrator 69 which generates a pulse that is applied to terminal 5-V. The width of the pulse that is present on terminal 5-V and indicated by dimension line 121 is determined by the capacitor 71 and, in a similar fashion, the width of the pulse that is present on terminal 51-Q is determined by the capacitor 73 as is the signal applied to terminal 5-R, indicated by dimension line 123.

The $\div$N counter 7 is synchronized with the time periods that are established by the reference signal present on conductor 13. The enable input E of the counter is activated by the Q output of the D-type flip-flop 65 which is set when a positive logic level is present on the Q terminal of the multivibrator 51 and reset only when there is an end count pulse 7-0, or an out-of-lock signal 63-P. This is exemplified in FIG. 3 by waveform 65-Q. When the pulse that is present on terminal 5-V leads the pulse that is present on terminal 5-R and there is a positive signal present on conductor 20 (terminal 5-DN), at the falling edge of the pulse on terminal 5-V, the D-type flip-flop is set by the rising edge of the signal that is present on terminal 69 $\bar{Q}$ of the multivibrator 69. This in turn will cause the $\bar{Q}$ terminal of the D-type flip-flop 57 to go positive as indicated by the waveform shown at 57-$\bar{Q}$ which in turn will cause the signal at terminal 63-P to go positive indicating an out-of-lock condition and thus, will forward bias the quick charge circuit 8 that includes the transistors 75 and 77 and bias resistors 79 and 81 causing these transistors to conduct shorting on one side of the capacitors 85 and 93 thereby accelerating the charging process of the integrator 9. At the next pulse that is present on terminal 7-0, the AND gate's 67 output will cause the D-type flip-flop 65 to set placing a logic 0 on the enable of the counter 7 which will force a logic 1 on terminal 7-0 until the occurrence of the next pulse on terminal 5-R. The D-type flip-flop 65 will also override the clock input to the D-type flip-flop 53 and thus maintain a positive logic 1 state to the input of the OR gate 54. At the occurrence of the next pulse on the 5-R terminal at time period 4 of FIG. 3, D-type flip-flop 53 and D-type flip-flop 55 are set replacing the enable and the counter will again initiate its counting. At time period 5, the VCO will have achieved essentially an in-phase relationship and at time period 6, the output frequency further approaches the tolerance of the circuitry and, thus, the logic 1 that is present on terminal 63-P is removed and the quick charge circuit 8 is deactivated. If there is a slight overshoot as shown at time period 6 and as indicated by the presence of an output pulse on terminal 5-UP, then the integrator 9 will cause the circuit to lock on frequency by integrating the pulse at time period 6 of waveform 5-UP.

For an increase in frequency, reference should be made to FIG. 4 in which, after a new N is entered on the counter 7 calling for an increase in frequency, the signal that is present on terminal 5-V follows the signal that is present on terminal 5-R at time period 1 and, consequently, on terminal 5-UP there is a pulse which has a pulse width less than the width of the pulses that are indicated by waveforms 5-R and 5-V during time period 1. However, at time period 2, the pulse width of the signal on terminal 5-UP has a width as indicated by dimension line 125 of waveform 5-UP that is greater than the width of the pulses of waveform 5-V as indicated by dimension line 121, and also, the width of the pulses of waveform 5-R as indicated by dimension line 123. Under these conditions in a similar manner as was discussed in conjunction with FIG. 3, the flip-flop 55's $\bar{Q}$ terminal is set to a logic 1 state which causes a positive pulse to be present on terminal 63-P and, consequently, the fast charge circuit 8 is activated. The enable to the counter 7 is removed by the setting of flip-flop 65 by its rising edge of the signal on terminal 63-P as illustrated by the comparison of waveforms 63-P and 65-Q between time periods 2 and 3. The flip-flop 53 is of course reset by the removal of the logic 1 from the S terminal of the flip-flop 53 and, consequently, at the occurrence of the next timing signal that is present on the $\bar{Q}$ terminal of the flip-flop 51 at time period 3, the OR gate 54 is disabled so there will be no comparison made during this time period between the signal that is present on terminal 5-R and 5-V.

At time period 3, the flip-flop 65 is set by the rising edge of the signal that is present on terminal 51-Q which in turn causes the output from terminal 7-0 of the $\div$N counter 7 to go negative. The Q output of flip-flop 53 is set to a logic 1 state also by the rising edge of the signal on terminal 51-Q. With the setting of flip-flop 53, the NOR gate 54 is enabled so that the phase detector 5 will reserve the pulses that are provided by the one-shot multivibrator 51. At the occurrence of the next time period, time period 4, there is a comparison of the normalized VCO signal which indicates that the signal on terminal 5-V occurs later than the signal that is present on terminal 5-R of the phase detector 5. Consequently, there is an output pulse at the 5-UP terminal which is integrated by the integrator 9. The resulting correction moves the output frequency of the voltage control oscillator closer to N times the frequency of the reference signals as indicated by the pulses on terminal 5-R during time period 5. At time period 6, the output of the $\div$N counter (the signal on terminal 7-0) is in phase with the signal on the 5-R terminal. Flip-flop 55 resets to the $\bar{Q}$ terminal to a logic 1 state removing the signal at 63-P and the forward biasing from the fast charge circuit 8.

Figure 5:
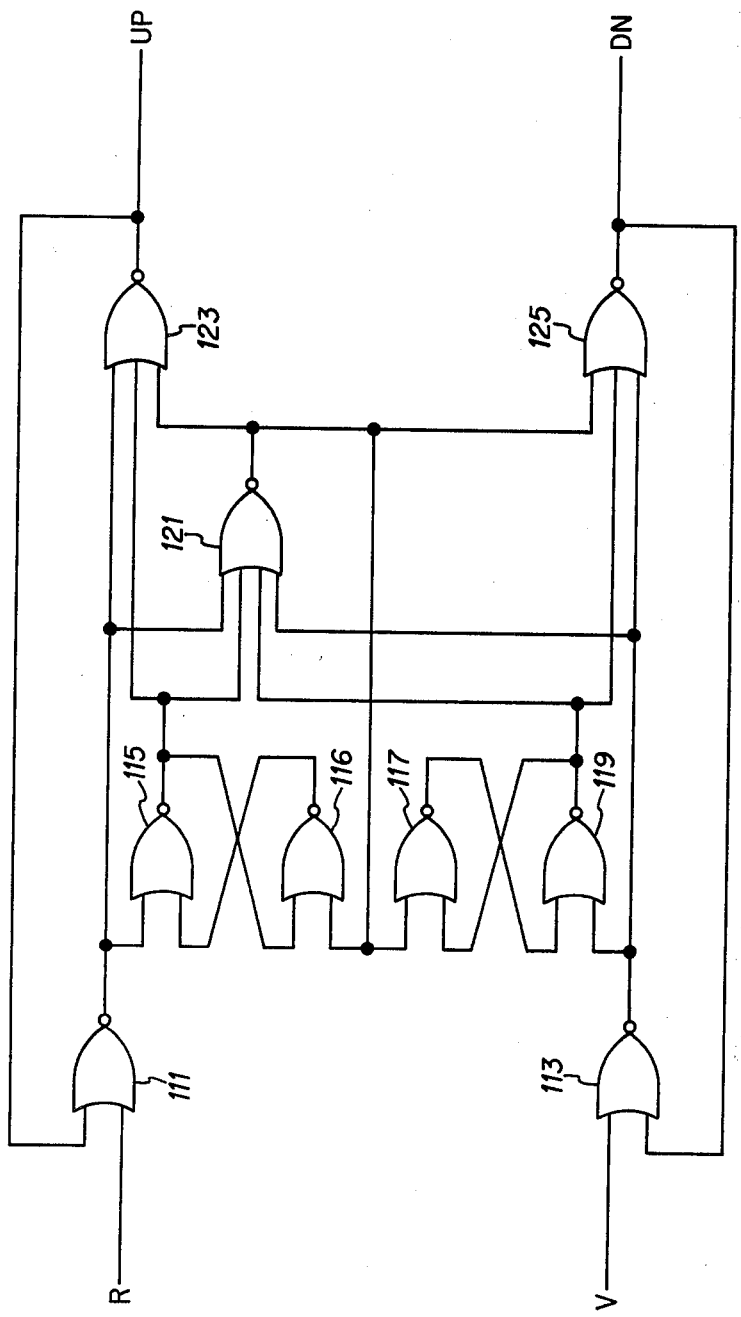
FIG. 5 is a schematic diagram of the phase detector according to FIG. 2.

The operation of the phase detector circuit which may be a commercially available device such as the phase frequency detector MC4344/MC4044 manufactured by Motorola Corporation or the circuitry provided in FIG. 5 to which reference should now be made. The R and V terminals are connected to OR gates 111 and 113 respectively, the output of which is used to set the RS flip-flops that include the OR gates 115 and 116 or the OR gates 117 and 119. The reset functions for the RS latches that are made from the above reference NOR gates are provided by the NOR gate 121 which is a four-input NOR gate that NOR's the output of NOR gate 111 with NOR gate 115, 119 and 113. The UP indication that is provided on the 5-UP terminal is the OR combination of the OR gate 123 which NOR's the output of the NOR gate 111, 115, and 121 and the DN indication is provided by the NOR gate 125 which NOR's the output functions from NOR gate 113, 119 and 121.

Many changes and modifications in the above described embodiment of the invention can, of course, be carried out without departing from the scope thereof. Accordingly, to promote the progress and science and the useful arts, the invention is disclosed and is intended to be limited only by the scope of the appended claims.

I claim:

1. A precision variable frequency source comprising:
   coincident detector means for detecting the difference between a first pulse and a second pulse and to provide a third pulse having a pulse width that represents the difference between the first pulse and the second pulse when the first pulse occurs earlier in time then the second pulse and to provide a fourth pulse having a pulse width that represents the difference between the first pulse and the second pulse when the second pulse occurs earlier in time than the first pulse;
   reference oscillator means for providing the first pulse;
   integrator means for integrating the third pulse and the fourth pulse and to provide a control signal;
   lock detector means for comparing the first pulse with the second pulse and to provide a fast charge activate signal when the falling edge of the first pulse occurs prior to the rising edge of the second pulse or when the falling edge of the second pulse occurs prior to the rising edge of the first pulse;
   fast charge means responsive to the fast charge activate signal for accelerating the operation of the integrator means;
   voltage controlled oscillator means for providing an output signal having a frequency that is controlled by the control signal; and
   counter means for providing the second pulse every selected number of cycles of the frequency of the output signals.

2. The precision variable control frequency source according to claim 1 wherein the reference oscillator means comprises:
   means for providing a controlled frequency; and
   reference gate means for providing a controlled pulse width for each first pulse from the controlled frequency.

3. The precision variable frequency source according to claim 1 wherein the counter means comprises:
   a divide by N ($\div$N) counter that provides a pulse each time that the voltage controlled oscillator is divided by N counts;
   a pulse shaper means for shaping the output pulse for a preselected pulse width; and a means for synchronizing the counter means with the first pulse.

4. The precision variable frequency source according to claim 1 wherein the coincidence detector comprises:
a phase detector for comparing the phase of the first pulse with the second pulse and to provide the third and fourth pulses.

5. A method for providing a precision variable frequency comprising:
detecting the difference between a first pulse and a second pulse when the first pulse occurs earlier in time than the second pulse;
providing a third pulse with a pulse width that represents the difference between the first pulse and the second pulse when the first pulse occurs earlier in time than the second pulse;
providing a fourth pulse with a pulse width that represents the difference between the first pulse and the second pulse when the second pulse occurs earlier in time than the first pulse;
providing the first pulse from a reference frequency source;
integrating the third pulse and the fourth pulse and providing a control signal for controlling the voltage controlled oscillator with the control signal thereby;
comparing the first pulse with the second pulse and providing a fast charge activate signal when the falling edge of the first pulse occurs prior to the rising edge of the second pulse or when the falling edge of the second pulse occurs prior to the rising edge of the first pulse;
accelerating the step of integrating the third pulse and the fourth pulse with the fast charge activate signal; and
dividing the output signal of the voltage controlled oscillator by a preselected number obtaining the second signal thereby.

6. The precision variable frequency source according to claim 1 further comprising:
reference gate means for providing a selectable pulse width for the first pulse; and
strobe gate means for providing a selectable pulse width for the second pulse.

* * * * *